United States Patent
Misumi et al.

(10) Patent No.: US 6,552,418 B2
(45) Date of Patent: Apr. 22, 2003

(54) RESIN-ENCAPSULATED SEMICONDUCTOR DEVICE

(75) Inventors: Kazuyuki Misumi, Tokyo (JP); Kazunari Michii, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/794,956

(22) Filed: Mar. 1, 2001

(65) Prior Publication Data

US 2002/0030251 A1 Mar. 14, 2002

(30) Foreign Application Priority Data

Sep. 14, 2000 (JP) ........................................ 2000-280612

(51) Int. Cl.⁷ ............................................. H01L 23/495
(52) U.S. Cl. ..................... 257/666; 257/676; 257/686; 257/692; 257/693; 257/783
(58) Field of Search ................................ 257/676, 686, 257/692, 693, 723, 730, 777, 783

(56) References Cited

U.S. PATENT DOCUMENTS 5,801,439 A * 9/1998 Fujisawa et al. ............ 257/686
6,072,243 A * 6/2000 Nakanishi ................... 257/783

FOREIGN PATENT DOCUMENTS

| JP | 5-121462 | 5/1993 |
| JP | 6-2713 | 1/1994 |
| JP | 11-163255 | 6/1999 |

* cited by examiner

Primary Examiner—David Nelms
Assistant Examiner—Mai-Huong Tran
(74) Attorney, Agent, or Firm—McDermott, Will & Emery

(57) ABSTRACT

A back surface of a semiconductor chip having an integrated circuit for a 64M DRAM is die-bonded to a first surface of a die pad provided virtually in the middle of the thickness of encapsulations resin, an electrode thereof and an upper surface of the tip end of an inner lead are wire bonded with a metal wire. A back surface of a semiconductor chip having an integrated circuit for a flash memory is die-bonded to a second surface of the die pad, and an electrode arranged at an end on the longer side and a back surface of an inner lead root portion are wire-bonded with a metal wire. Then, these elements are integrally encapsulated with encapsulation resin. Thus, a thin, compact, reliable and inexpensive lead frame with large integration capacity and a resin-encapsulated semiconductor device using the lead frame produced by integrally resin-encapsulating a plurality of semiconductor chips including at least a center pad type semiconductor chip are provided.

28 Claims, 15 Drawing Sheets

RESIN-ENCAPSULATED SEMICONDUCTOR DEVICE

BACKGROUND OF THE INVENTION

1. Field of the Invention

The present invention relates to a resin-encapsulated semiconductor device comprising a resin integrally encapsulating a plurality of semiconductor chips including at least a center pad semiconductor chip in order to increase the integration capacity and improve the function and to a resin-encapsulated semiconductor device using a thin, compact and inexpensive lead frame.

2. Description of the Related Art

In recent years, various electronic devices have come to have their function improved and size and weight reduced remarkably and hence there has been a strong demand in the field of art for semiconductor devices to be incorporated into such electronic devices whose package has a smaller thickness and size as well as increased storage capacity, improved function and higher integration density. To meet this demand, a semiconductor device produced by a so-called multi-chip package technique has been proposed, according to which two semiconductor chips are integrally encapsulated with resin. As an example, Japanese Utility Model Laid-Open No. 6-2713 discloses a resin-encapsulated semiconductor device produced by rigidly placing at least two semiconductor chips perpendicularly to one another with insulator therebetween on a die pad and electrodes provided in the same direction, and connecting the electrodes of the semiconductor chips and leads provided in four directions with a metal wire, followed by encapsulation with resin mold. Japanese Patent Laid-Open No. 5-121462 discloses a resin-encapsulated semiconductor device produced by placing a first semiconductor chip on the side of a first surface of a semiconductor chip placing portion and a second semiconductor chip on the side of a second surface of the semiconductor chip placing portion, followed by wire bonding and resin encapsulation. Japanese Patent Laid-Open No. 11-163255 discloses an LOC type, resin-encapsulated semiconductor device having two semiconductor chips therein produced by placing two center pad type semiconductor chips each having electrodes in the center of a surface thereof and their back surfaces opposing one another, branching an inner lead into two branches, one of which is secured to a surface of one semiconductor chip with an insulating film therebetween, while the other branched inner lead is secured to the other surface of the semiconductor chip with an insulting film therebetween, followed by integral resin encapsulation as the tip end portion of each inner lead is connected with an electrode of each semiconductor chip with a Au wire.

However, the two semiconductor chips used according to the invention as disclosed by Japanese Utility Model Laid-Open No. 6-2713 and Japanese Patent Laid-Open No. 5-121462 each have electrodes provided in the vicinity of the periphery of the semiconductor chip. If the capacity of the semiconductor device is to be increased, the semiconductor chip size is inevitably large if the package size is restricted to be small. However, if electrodes are provided around the semiconductor chip, the increase in the size of the semiconductor chip is limited because a prescribed length should be secured for the inner lead. Furthermore, if the tip end of the inner lead is to be provided as close as possible to the semiconductor chip in order to secure a long size for the inner lead, the metal wire is in contact with the edge of the semiconductor chip, and in order to avoid the problem, the height of the bonding wire must be increased, which leads to increase in the package thickness. More specifically, in the resin-encapsulated semiconductor device according to the structure as disclosed by the document, if the two-dimensional size and the thickness of the package are limited, too much restriction is imposed in increasing the capacity of the semiconductor device, so that the capacity cannot be greatly increased.

According to the invention as disclosed by Japanese Patent Laid-Open No. 11-163255, center pad type, semiconductor chips allow the occupying area in a package and the capacity to be readily increased, which is advantageous for increasing the capacity, while a complicated structure results in which an inner lead is secured to the surface of the semiconductor chips through an insulating film, so that the material and assembling costs could be high. Particularly, in terms of facility, a novel manufacturing facility should be introduced, which could disadvantageously increase redemption for the installation. In an absorbent heat cycle test, peeling might arise.

SUMMARY OF THE INVENTION

The present invention is directed to a solution to the above-described problem, and it is an object of the present invention to provide a resin-encapsulated semiconductor device comprising a resin integrally encapsulating a plurality of semiconductor chips including at least one center pad type semiconductor chip, so that the integration capacity can be increased, the function can be improved and a thin, compact, inexpensive and reliable package can be obtained.

According to present invention, A resin-encapsulated semiconductor device, comprising:

a first semiconductor chip provided with a plurality of electrodes on a centerline at the center of an upper surface thereof, first metal wires each connected to each electrode of the first semiconductor chip, a second semiconductor chip provided with a plurality of electrodes at an end of an upper surface thereof, second wires each connected to each electrode of the second semiconductor chip, a die pad having at least one die bond surface, and supporting the first and second semiconductor chips, and a plurality of inner leads arranged near an end of the die pad, wherein the plurality of inner leads each having a first surface to which each of the first metal wires is wire-bonded, and a second surface to which each of the second metal wires is wire-bonded, and the first and second surfaces being positioned on different planes substantially parallel to the die bond surface and apart from one another.

By the structure of the resin-encapsulated semiconductor device, a compact and thin resin-encapsulated semiconductor device with large capacity which has two semiconductor chips stored therein and allows the metal thin lines from contacting the edge of the chips. In the arrangement in which the first and second surfaces are positioned on different planes substantially parallel to the die bond surface and apart from one another, at least one semiconductor chip has a plurality of electrodes on a centerline thereof, and if a metal wire connecting an electrode thereof and an inner lead is long, the metal thin line can be effectively prevented from contacting the edge of the semiconductor chip.

And a resin-encapsulated semiconductor device according to the present invention, comprising:

a die pad having first and second die bond surfaces opposing each other, a first semiconductor chip die-bonded on the first die bond surface having a plurality of electrodes on a centerline at the center of an upper surface thereof, first metal wires each connected to each electrode of the first semiconductor chip, a second semiconductor chip die-bonded on the second die bond surface having a plurality of electrodes on a centerline at the center of an upper surface thereof, second wires each connected to each electrode of the second semiconductor chip, and a plurality of inner leads arranged near an end of the die pad, wherein the plurality of inner leads each having a first surface to which each of the first metal wires is wire-bonded, and a second surface to which each of the second metal wires is wire-bonded, and the first and second surfaces being positioned on different planes substantially parallel to the die bond surface and apart from one another.

Also a resin-encapsulated semiconductor device according to the present invention, comprising:

a die pad having two opposing die bond surfaces, two semiconductor chips each die-bonded to each of the die bond surfaces, and having a thickness of at most 150 μm provided with electrodes on a centerline in the center of an upper surface thereof, metal wires each wire-bonded to each of electrodes of each of the semiconductor chips, a plurality of inner leads provided in the close proximity to a pair of opposing ends of the die pad along the electrode arrangement of the semiconductor chip and to which each of the metal wires connected to the surface in the vicinity of the inner end thereof, and a encapsulation resin with which the semiconductor chips, the die pad, the metal wires and the inner leads are encapsulated.

In the resin-encapsulated semiconductor device according to the present invention, two semiconductor chips having electrodes arranged on a centerline thereof are die-bonded to the opposing die bond surfaces of the die pad, so that a compact and thin resin-encapsulated semiconductor device with large capacity can be provided.

DESCRIPTION OF THE PREFERRED EMBODIMENTS

[First Embodiment]

Figure 1:
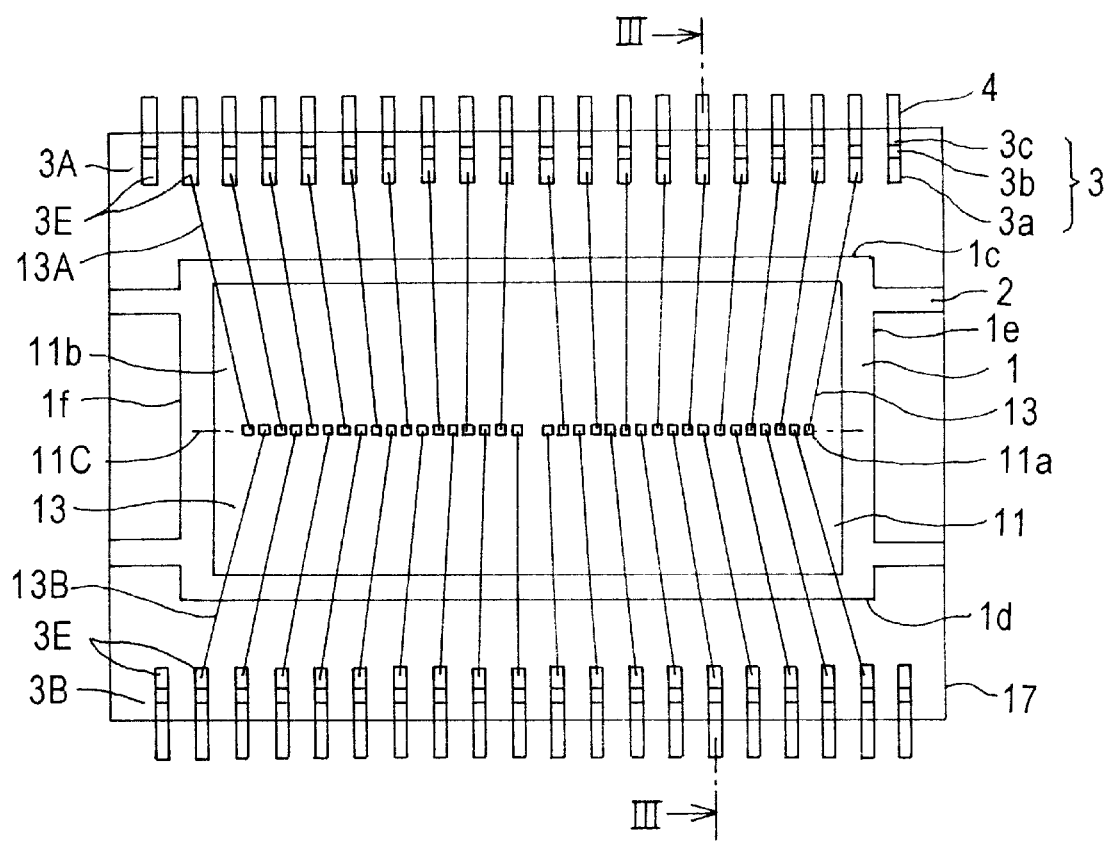
FIG. 1 is a plan view of a section of a main part of a resin-encapsulated semiconductor device on one surface side according to a first embodiment of the present invention.
Figure 2:
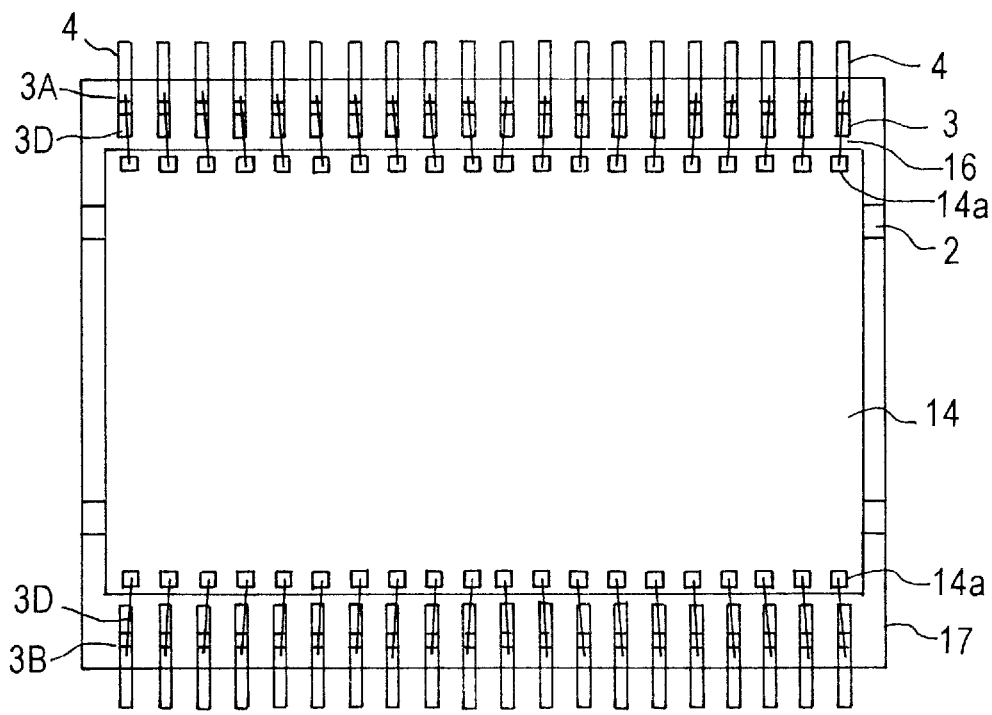
FIG. 2 is a plan view of a section of the main part on the opposite surface side to the surface in FIG. 1.
Figure 3:
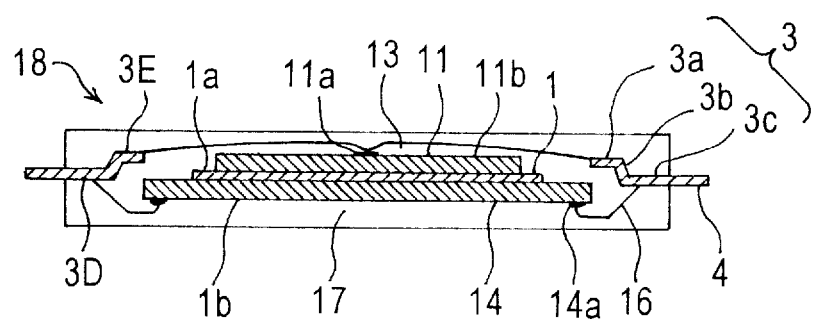
FIG. 3 is a sectional view taken along line III—III in FIG. 1.

One embodiment of the present invention will be now described in conjunction with the accompanying drawings. FIG. 1 is a plan view of a section of a main part of a resin-encapsulated semiconductor device according to a first embodiment of the present invention on one surface side, FIG. 2 is a plan view of a section of the main part on the opposite surface side to the surface shown in FIG. 1, and FIG. 3 is a sectional view taken along line III—III in FIG. 1. In the drawings, reference numeral 1 represents a die pad provided virtually in the central part of encapsulation resin 17, and the pad has two die bond surfaces 1a and 1b opposing and parallel to one another at its upper and lower surfaces, respectively. The die pad 1 also has a pair of opposing long end surfaces 1c and 1d and a pair of opposing short end surfaces 1e and 1f.

A back surface of a semiconductor chip 11 provided with an integrated circuit for a 64M DRAM (Megabit Dynamic Random Access Memory) for example on a surface thereof and a rectangular two-dimensional shape is die-bonded to the first die bond surface 1a. The semi conductor chip 11 has a plurality of electrodes 11a provided on a centerline 11c in the center of the upper surface 11b, and each electrode 11a is formed of an aluminum film.

Reference numeral 2 represents a suspending lead coupled to the frame of a lead frame (both not shown) and supporting the die pad 1, reference numeral 3 represents an inner lead provided adjacent to each of a plurality of outer leads 4 and there are a plurality of such inner leads. The plurality of inner leads 3 include a plurality of inner leads 3A provided along the end surface 1c described above, and a plurality of inner leads 3B provided along the end surface 1d described above.

The plurality of inner leads 3 each have an inner end portion 3a, an inner lead root portion 3c and a bent portion 3b therebetween. The root portion 3c is provided flush with the die pad 1, and continues to the outer lead 4 projecting outwardly from the middle of the encapsulation resin 17 in the thickness-wise direction and has a first surface 3D provided in a plane including the second die pad surface 1b of the die pad 1 at its lower surface. The inner lead inner end portion 3a is bent to the side of the semiconductor chip 11 from the root portion 3c to the bent portion 3b, and extends toward the semiconductor chip 11. The inner end portion 3a has at its upper surface a second surface 3E formed on a plane parallel to the die bond surfaces 1a and 1b and positioned above the upper surface 11b of the semiconductor chip 11 by at most 50 μm. As a result, the first surface 3A and the second surface 3B are provided on two planes parallel to and apart from one another, and more specifically the first surface 3A is provided on a plane including the die bond surface 1b and the second surface 3B is provided on a plane parallel to the die bond surfaces 1a and 1b and positioned above the upper surface 11b of the semiconductor chip 11 by a prescribed distance.

Reference numeral 13 represents a plurality of metal wires each of which electrically connects each electrode 11a and a corresponding inner end portion 3a of the lead frame, and is wire-bonded at the second surface 3B to the inner end portion 3a. The plurality of metal wires 13 include a first metal wire group 13A arranged on the side of the long end surface 1c of the die pad 1, and a second metal wire group 13B arranged on the side of the longer end surface 1d of the die pad 1. The metal wires 13 are each wire-bonded using a Au wire typically having a diameter in the range from 20 to 30 μm. The wire bonding is executed by a general ultrasonic bonding method.

In this case, metal wires 13 each have a loop length about as long as 4 to 5 mm, but the metal wire 13 is stitch-bonded to the second surface 3E at the upper surface of the inner lead end portion 3a positioned above the upper surface 11b of the semiconductor chip 11 by at most 50 μm, so that the metal wire 13 will not be in contact with the edge of the semiconductor chip 11 somewhere along the way. Note that the higher the level of the second surface 3E at the upper surface of the inner lead inner end portion 3a, the more advantageous it will be for preventing the metal wire 13 from contacting the edge, while the metal wire 13 must be prevented from being exposed as the thickness of the encapsulation resin 17 is restricted. Therefore, the height is restricted to the level above by at most 50 μm as described above. The area occupied by the semiconductor chip in the encapsulation resin in the LOC-type, resin-encapsulated semiconductor device using a center pad type semiconductor chip can be about 70%, which is significantly advantageous in reducing the size and increasing the capacity as compared to about 35% for a semiconductor chip having an ordinary structure in which electrodes are arranged in the periphery.

Reference numeral 14 represents a semiconductor chip having for example an integrated circuit for a flash memory formed on a surface thereof. The back surface thereof is die-bonded to the second die bond surface 1b of the die pad 1. Reference numeral 14a represents for example an electrode for an integrated circuit formed of an aluminum film and provided in the vicinity of both ends on the long sides of the semiconductor chip 14, reference numeral 16 represents a metal wire which electrically connects each electrode 14a and a first surface 3D at the lower surface of the inner lead root portion 3c, and the metal wire is wire-bonded to the surface of each electrode 14a and the second surface 3D using a metal wire of the same diameter as that of the metal wire 13 according to a general ultrasonic bonding method.

After the assembling as described above, encapsulation resin 17 is formed using epoxy resin by a transfer mold method, and the die pad 1, the inner lead 3, the semiconductor chip 11, the metal wire 13, the semiconductor chip 14, the metal wire 16 and the suspending lead 2 are integrally encapsulated. The outer leads 4 are processed into a prescribed shape, so that the resin-encapsulated semiconductor device 18 is completed. Note that in this case, the die pad 1 and the inner lead root portion 3c are provided virtually in the middle of the thickness of the encapsulation resin 17, so that pressure balance is achieved between the upper and lower parts of the resin at the time of resin encapsulation. The distances between the metal wire 13 and the upper surface of the encapsulation resin 17 and between the metal wire 16 and the lower surface of the encapsulation resin 17 are both at least 50 μm in order to prevent the metal wires 13 and 16 from being exposed at the outer surface, so that a high quality, thin package is formed.

According to the first embodiment, as described above, the thin compact, high density center pad type semiconductor chip 11 and the semiconductor chip 14 of the general structure having electrodes arranged in the periphery are die-bonded to the front and back surfaces of the die pad 1, respectively in a single package. As the second surface 3E at the upper surface of the inner lead inner end portion 3a is provided at a level above the upper surface 11b of the semiconductor chip 11 by at most 50 μm, the metal wires 13 and 16 are connected by general stable inexpensive wire bonding, and then they are integrally encapsulated with resin, so that the package can be reduced in thickness and size, regardless of the high integration capacity and high functions achieved. As a result, an inexpensive and reliable resin-encapsulated semiconductor device which allows the metal wires 13, 16 to be prevented from contacting each edge of the semiconductor chips 11, 14 is provided.

Figure 4:
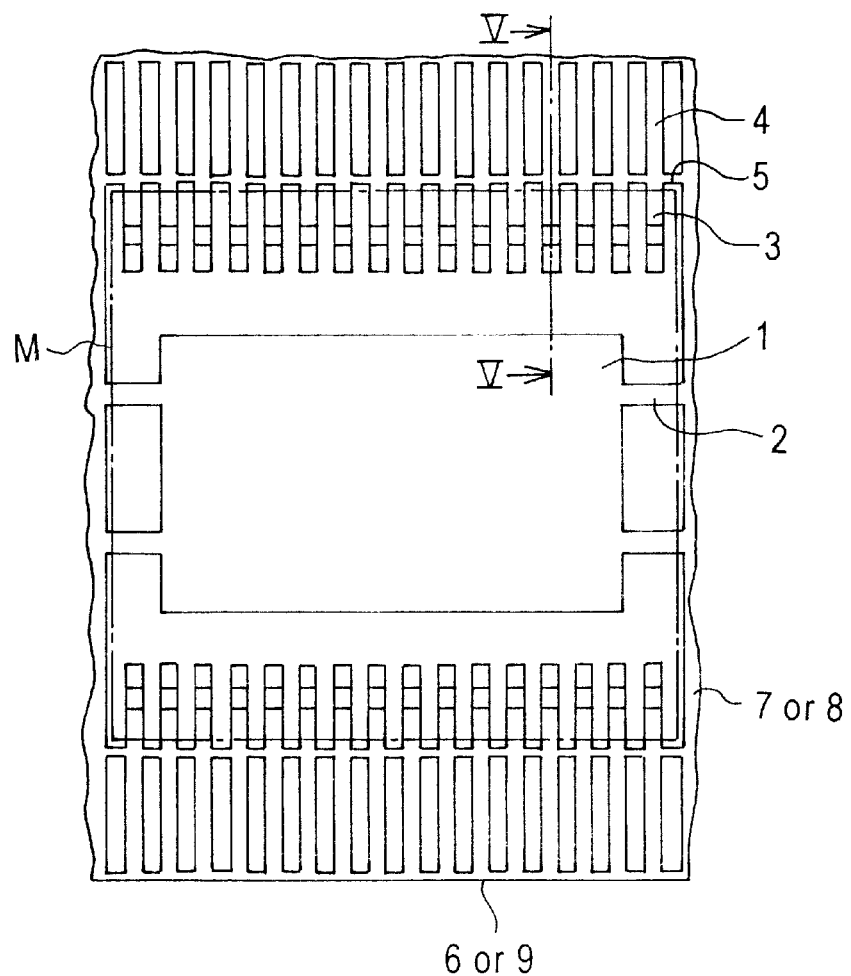
FIG. 4 is a plan view of a resin-encapsulated part in a lead frame in the resin-encapsulated semiconductor device according to the first embodiment of the present invention.
Figure 5:
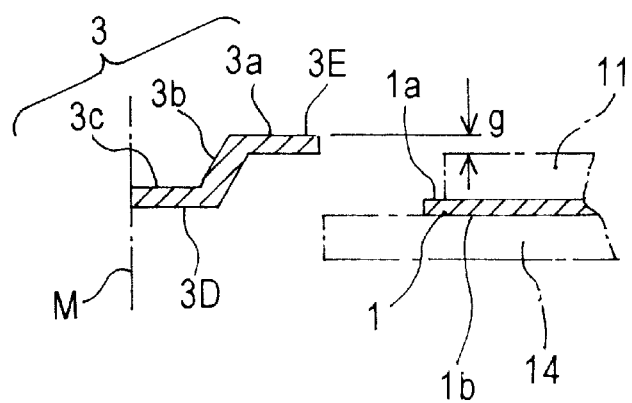
FIG. 5 is a sectional view taken along line V—V in FIG. 4.
Figure 6:
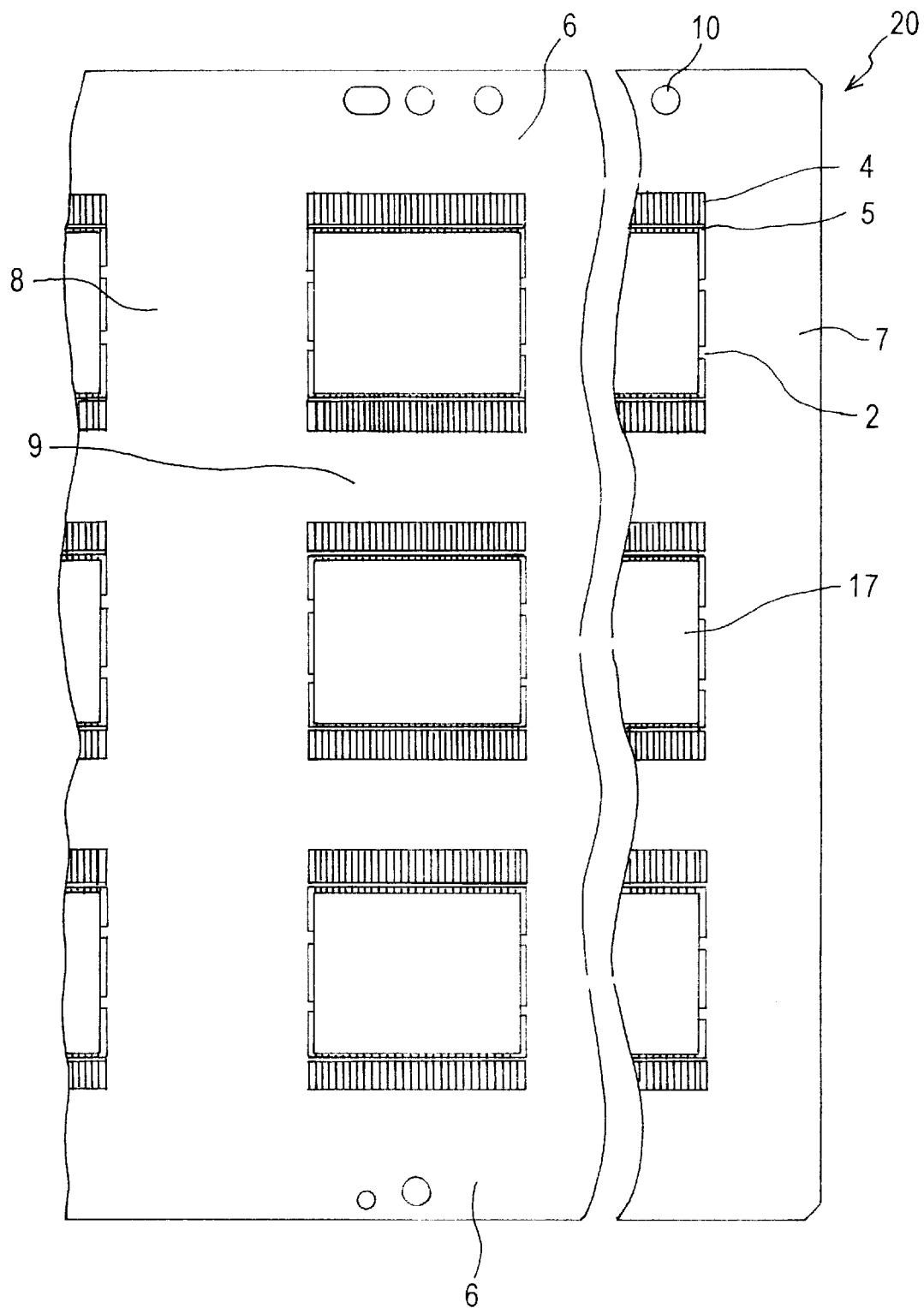
FIG. 6 is a plan view of the lead frame after the step of resin encapsulation in the resin-encapsulated semiconductor device according to the first embodiment of the present invention.

The structure of a lead frame used in the resin-encapsulated semiconductor device 18 will be now described. FIG. 4 is a plan view of a resin-encapsulated part in the lead frame in the resin-encapsulated semiconductor device according to the first embodiment of the present invention. FIG. 5 is a sectional view taken along line V—V in FIG. 4, and FIG. 6 is a plan view of the lead frame after the step of resin encapsulation in the resin-encapsulated semiconductor device according to the first embodiment of the present invention. In FIG. 4, the suspending lead 2 is coupled to a vertical outer frame 7 or a horizontal direction separator plate 8 (both not shown) of the lead frame 20 to support the die pad 1. Reference numeral 5 represents a tie bar which couples the outer leads 4 in the vicinity of the outer surface of the encapsulation resin 17 and has an end coupled to the vertical outer frame 7 or the horizontal direction separator plate 8 described above. Thus, as shown in FIG. 5, the inner lead 3 is bent upwardly from the inner lead root portion 3c provided flush with the die pad 1 to the bent portion 3b and the inner end portion 3a formed into an inner end to extend above the semiconductor chip 11. The second surface 3E at the upper surface of the inner end portion 3a is formed on a plane parallel to the first die pad surface 1a of the die pad 1, and positioned above the upper surface 11b of the semiconductor chip 11 die-bonded to the die pad surface 1a by a size g, which is set to be at most 50 $\mu$m. Note that the first surface 3D is flush with the die bond surface 1b. The chain-dotted line M in FIGS. 4 and 5 represents the outer edge of the encapsulation resin 17.

As shown in FIG. 6, in the lead frame 20, using a 42% Ni—Fe alloy material, for example, pieces of encapsulation resin 17 after the step of resin encapsulation are arranged in 3 rows separated by horizontal direction separator 9 from one another between horizontal frames 6 at parallel upper and lower ends and 10 columns (only part of which is shown) separated by vertical direction separator 8 from one another between vertical outer frames 7 (only the right end is shown) at parallel, both ends. Reference numeral 10 represents a feeding hole provided at the horizontal frame 6. In the succeeding steps, the lead frame 20 is sequentially fed in the horizontal direction through the feeding hole 10, and the tie bar 5, the outer lead 4 and the suspending lead 2 are cut by a known method. Thus, the outer leads 4 are processed into a prescribed shape, and the resin-encapsulated semiconductor device 18 is completed.

[Second Embodiment]

Figure 7:
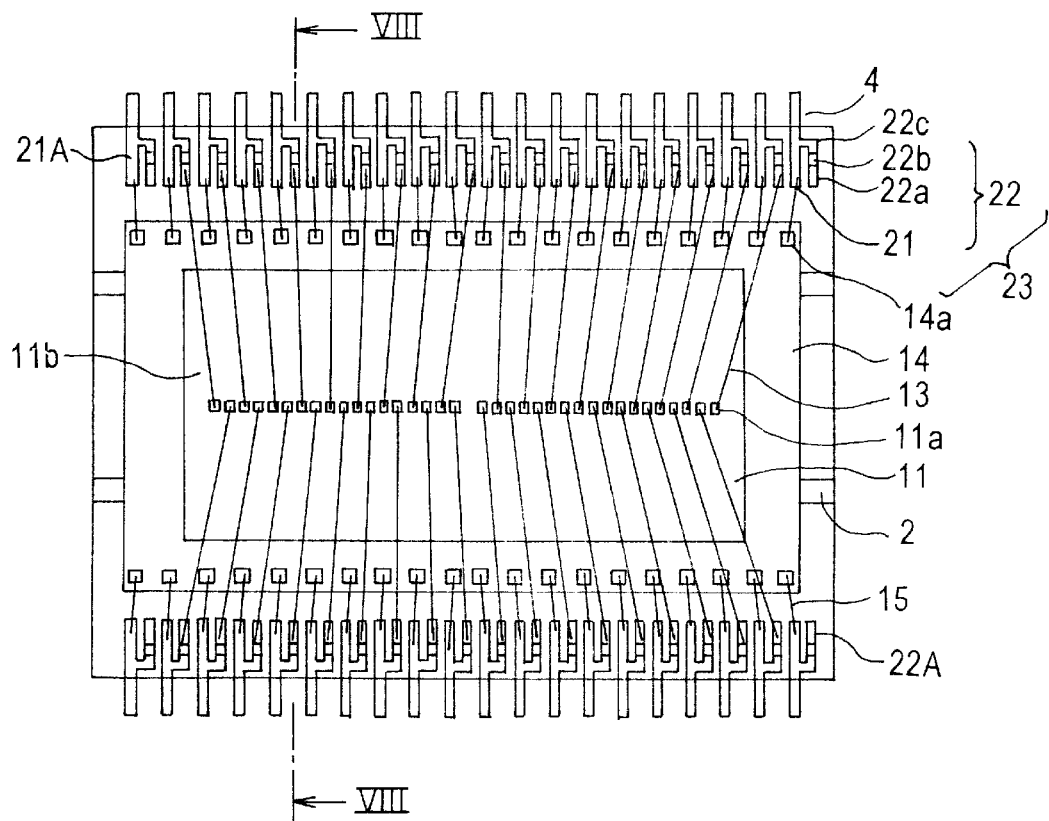
FIG. 7 is plan view of a section of a main part of a resin-encapsulated semiconductor device according to a second embodiment of the present invention.
Figure 8:
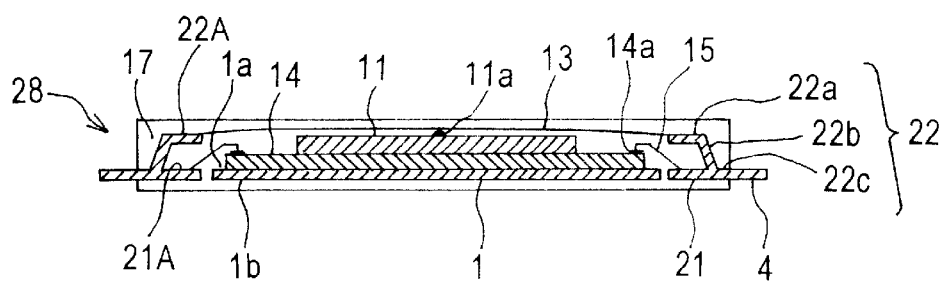
FIG. 8 is a sectional view taken along line VIII—VIII in FIG. 7.

FIG. 7 is a plan view of a section of a main part of a resin-encapsulated semiconductor device according to a second embodiment of the present invention. FIG. 8 is a sectional view taken along line VIII—VIII in FIG. 7. As shown, in the resin-encapsulated semiconductor device 28 according to the second embodiment, the back surface of the semiconductor chip 14 described above is die-bonded to the first die pad surface 1a of the die pad 1, and the back surface of the semiconductor chip 11 is die-bonded to the central part on the upper surface 14b of the semiconductor chip 14 using an insulating adhesive or an insulating adhesive tape (not shown). In this case, the electrodes 11a, 14a are arranged in the same direction along each longer side of the semiconductor chips 11 and 14. Reference numeral 23 represents an inner lead, and there are a first inner lead portion 21 provided adjacent to an outer lead 4 formed flush with the die pad 1 and extending linearly toward the die pad 1, and a second inner lead portion 22 branched from the first inner lead portion 21 to an adjacent side. The first surface 21A at the upper surface of the first inner lead portion 21 is flush with the die bond surface 1a. The second inner lead portion 22 has a branch inner lead root portion 22c branched from the first inner lead portion 21 to a adjacent side on the same plane. The second inner lead portion 22 is bent from the branch inner lead root portion 22c toward the side of the semiconductor chip 11 at a bent portion 22b and coupled to a branch inner lead inner end portion 22a. Similarly to the second surface 3E at the upper surface of the inner lead inner end portion 3a according to the first embodiment, the second surface 22A at the upper surface of the branch inner lead inner portion 22a is provided on a plane parallel to the first die bond surface 1a of the die pad 1, and positioned above the upper surface 11b of the semiconductor chip 11 by at most 50 $\mu$m.

Then, by wire-bonding according to a general ultrasonic bonding method, the electrode 14a and the first surface 21A at the upper surface of the inner end portion of the first inner lead portion 21 are connected with a metal thin line 15, while the electrode 11a and the second surface 22A at the upper surface of the branch inner lead inner end portion 22a are connected with a metal wire 13. Then, similarly to the first embodiment, the die pad 1, the semiconductor chip 11, the metal wire 13, the semiconductor chip 14, the metal thin line 15, the inner lead 23 and the suspending lead 2 are integrally encapsulated with encapsulation resin 17, the outer leads 4 are processed into a prescribed shape and the resinencapsulated semiconductor device 28 is completed. Note that the structure of the lead frame (not shown) used to form the resin-encapsulated semiconductor device 28 is identical to that according to the first embodiment (described in conjunction with FIGS. 4 and 6) except that the inner lead 23 has the above-described structure. In this case, the distances between the metal wire 13 and the upper surface of the encapsulation resin 17 and between the second surface 1b of the die pad 1 and the lower surface of the encapsulation resin 17 are both set to be at least 50 $\mu$m, so that the metal wire 13 and the die pad 1 are prevented from being exposed at the outer surface of the encapsulation resin 17, and a high quality, thin package is formed. The resin-encapsulated semiconductor device 28 according to the second embodiment has the above-described structure and therefore the same effect as that brought about by the first embodiment is provided.

[Third Embodiment]

Figure 9:
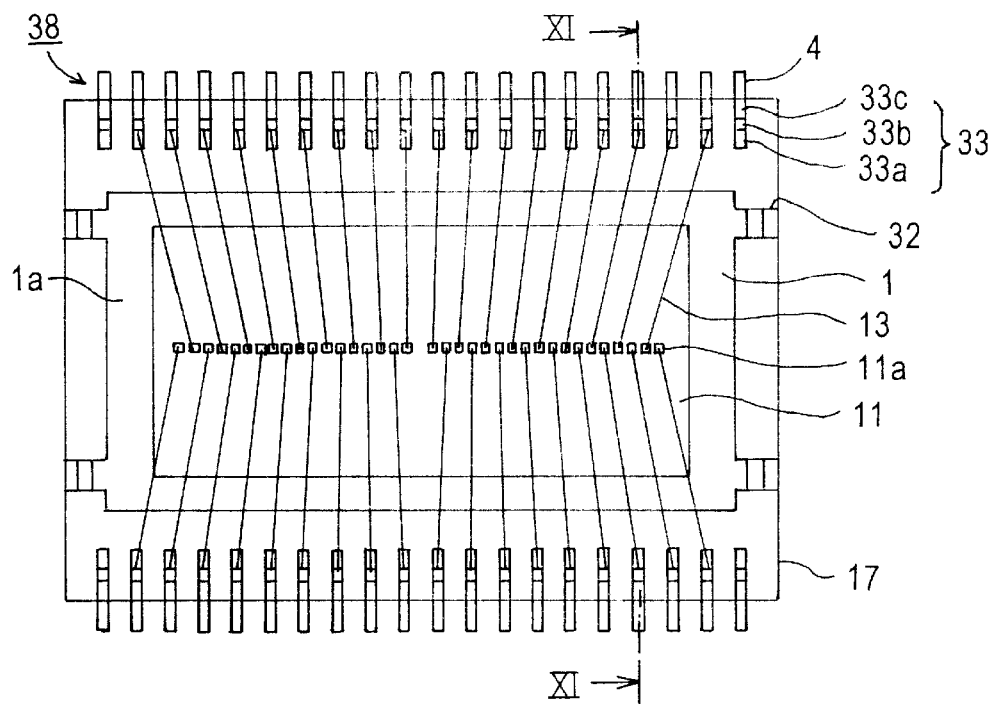
FIG. 9 is a plan view of a section of a main part of a resin-encapsulated semiconductor device on one surface side according to a third embodiment of the present invention.
Figure 10:
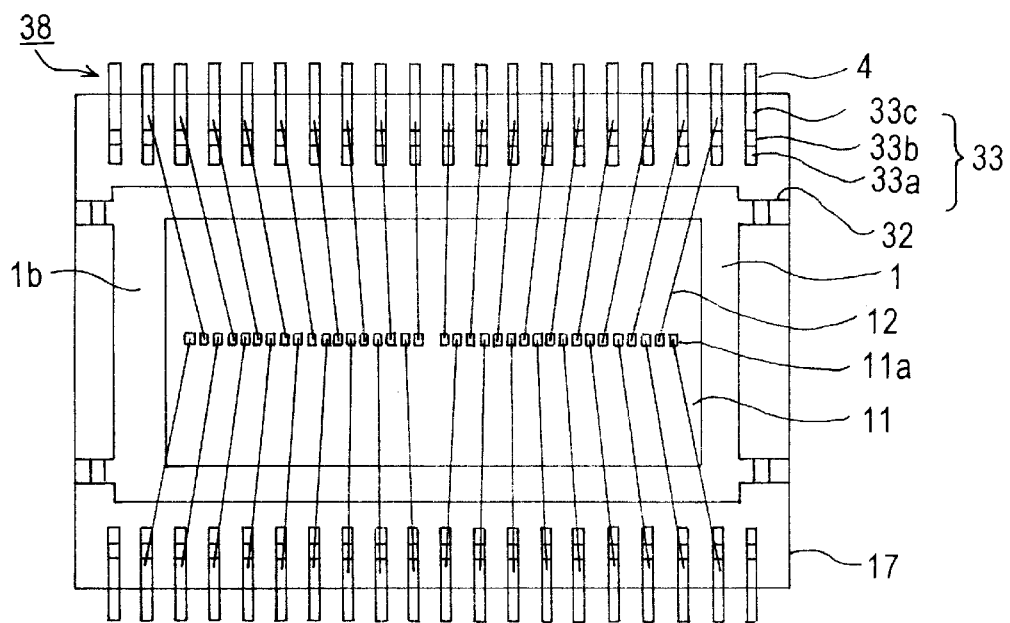
FIG. 10 is a plan view of a section of the main part on the opposite surface side to the surface in FIG. 9.
Figure 11:
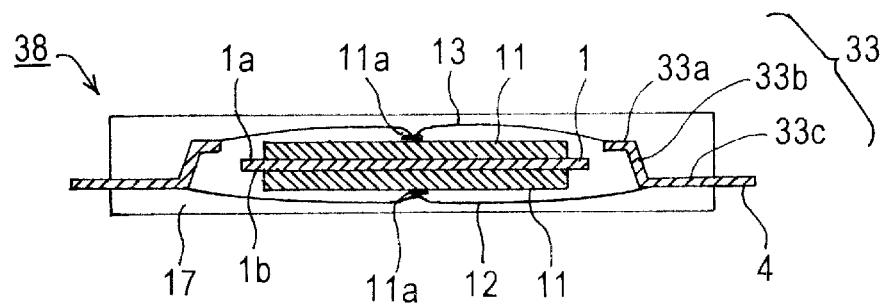
FIG. 11 is a sectional view taken along line XI—XI in FIG. 9.

FIG. 9 is a plan view of a section of a main part of a resin-encapsulated semiconductor device according to a third embodiment of the present invention on one surface side, FIG. 10 is a plan view of a section of the main part on the opposite surface side and FIG. 11 is a sectional view taken along line XI—XI in FIG. 9. As shown, in the manufacture of the resin-encapsulated semiconductor device 38 according to the third embodiment, a semiconductor chip 11 (the upper side semiconductor chip 11) is die-bonded to the first die bond surface 1a of the die pad 1 provided virtually in the middle of the thickness of the encapsulation resin 17, then the lead frame (not shown) is turned over, and a semiconductor chip 11 (the lower side semiconductor chip 11) is die-bonded to the second die bond surface 1b of the die pad 1. Then, the electrode 11a of the lower side semiconductor chip 11 die-bonded to the second die bond surface 1b of the die pad 1 and a first surface 33A at the lower surface of an inner lead root portion 33c are wire-bonded with a metal thin line 12. The first surface 33A described above is provided on a plane positioned below the lower surface of the lower side semiconductor chip 11 by at most 50 $\mu$m. Then, the lead frame (not shown) is turned over, the electrode 11a of the upper side semiconductor chip 11 die-bonded to the first die bond surface 1a of the die pad 1 and a second surface 33B at the upper surface of an inner lead inner end portion 33a are wire-bonded by a metal wire 13. The second surface 33B is provided on a plane positioned above the upper surface of the upper side semiconductor chip 11 by at most 50 µm. At the time of wire-bonding with the metal wire 13, the lower semiconductor chip 11 and the metal wire 12 should be supported by the lower surface of the die pad 1 or the like so that they are not damaged. Reference numeral 32 represents a suspending lead which supports the die pad 1. After the assembling as described above, the die pad 1, the upper and lower semiconductor chips 11, the metal wires 12, 13, the inner lead 33 and the suspending lead 32 are integrally encapsulated with the encapsulation resin 17.

With the advent of various highly functional, compact and lightweight electronic devices, demands for resin-encapsulated semiconductor devices with higher functions and larger capacity have been accelerated. For example, as the 64M DRAM has come to be accepted as a general standard in the market, there has already existed a customer's demand for even larger capacity, 128M DRAMs. It should be understood that to quickly meet this demand, 128M DRAM semiconductor devices should be developed and supplied as soon as possible and yet it would take long until newly developed devices become stably and commercially available. In such a case, the resin-encapsulated semiconductor device according to the third embodiment of the present invention having the combination of two sets of 64M DRAMs which have been stable in quality and utilized for considerable time to achieve the demanded large capacity has a merit in that the arrangement allows thin and compact devices with stable quality to be supplied quickly to meet the customer's demand.

Figure 12:
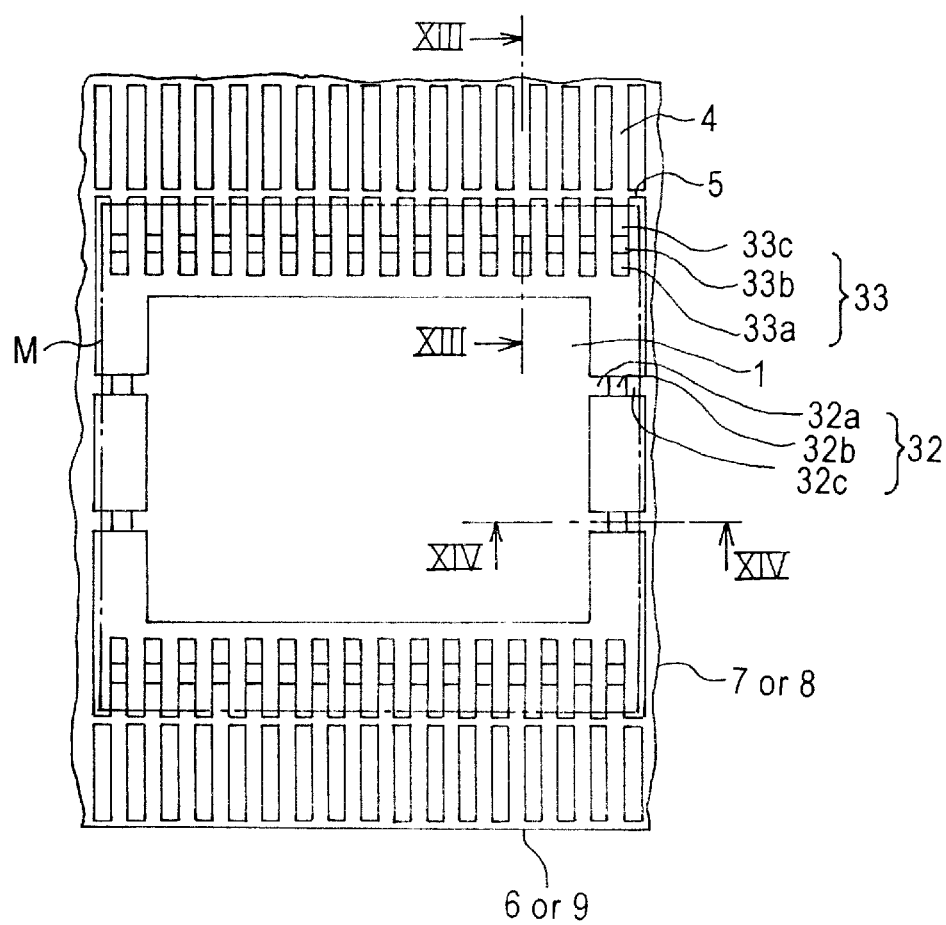
FIG. 12 is a plan view of a resin-encapsulated part in the lead frame in the resin-encapsulated semiconductor device according to the third embodiment of the present invention.
Figure 13:
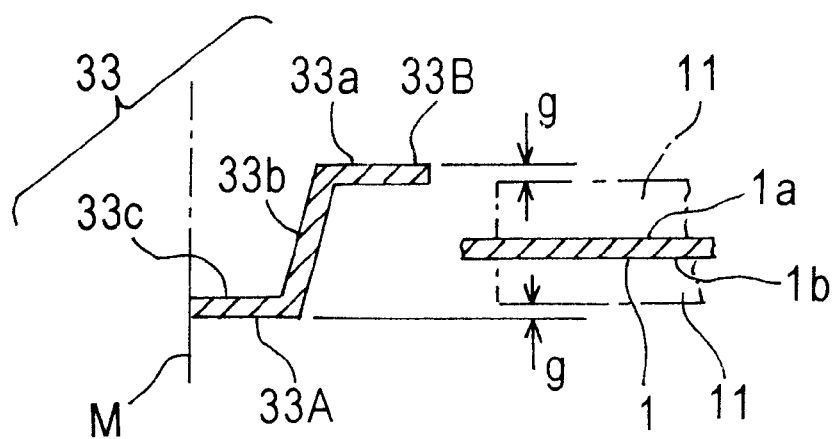
FIG. 13 is a sectional view taken along line XIII—XIII in FIG. 12.
Figure 14:
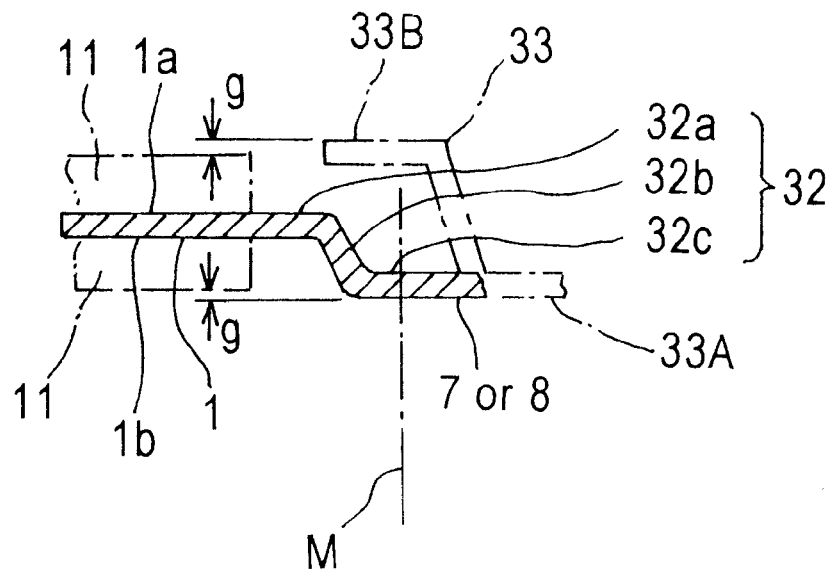
FIG. 14 is a sectional view taken along line XIV—XIV in FIG. 12.

The structure of the lead frame used in the resin-encapsulated semiconductor device 38 will be now described. FIG. 12 is a plan view of a resin-encapsulated part in the lead frame in the resin-encapsulated semiconductor device according to the third embodiment of the present invention, FIG. 13 is a sectional view taken along line XIII—XIII in FIG. 12, and FIG. 14 is a sectional view taken along line XIV—XIV in FIG. 12. In FIG. 12, the suspending lead 32 is coupled to the vertical outer frame 7 or horizontal direction separator plate 8 (both not shown) of the lead frame and supports the die pad 1 at a prescribed raised level. Reference numeral 33 represents an inner lead. As shown in FIG. 13, the inner lead 33 has an inner lead root portion 33c provided adjacent to the outer lead 4 coupled to the horizontal outer frame 6 or vertical direction separator plate 9 (both not shown) of the lead frame, a bent portion 33b bent upwardly from the inner lead root portion 33c, and an inner end portion 33a extending from the bent portion 33b to the side of the upper side semiconductor chip 11. The second surface 33B at the upper surface of the inner end portion 33a is provided on a plane parallel to the first die bond surface 1a of the die pad 1 and positioned above the upper surface 11b of the upper side semiconductor chip 11 die-bonded to the die bond surface 1a of the die pad 1 by at most 50 µm. Note that in this case, the first surface 33A at the lower surface of the inner lead root portion 33c is provided on a plane positioned below the lower surface of the lower side semiconductor chip 11 joined to the second die bond surface of the die pad 1 by at most 50 µm.

As shown in FIG. 14, the suspending lead 32 includes a suspending lead root portion 32c coupled to the vertical frame 7 or horizontal direction separator plate 8 (both not shown) of the lead frame, a bent portion 32b bent upwardly from the suspending lead root portion 32c, and a suspending lead inner end portion 32a formed horizontally from the bent portion 32b and coupled to the die pad 1. Thus, the die pad 1 is provided virtually in the middle of the thickness of the encapsulation resin 17. The second surface 33B at the upper surface of the inner lead inner end portion 33a or the first surface 33A at the lower surface of the inner lead root portion 33c is formed from the upper or lower surface of the semiconductor chip 11 joined to each of the first and second die bond surfaces 1a and 1b of the die pad 1 so that the size g is at most 50 µm as shown. Note that the parts other than those described in conjunction with FIGS. 12 to 14 are the same as those of the lead frame shown in FIG. 6. Thus, at the time of wire-bonding, the metal wires 12, 13 are prevented from contacting the edge of each semiconductor chip 11. Note that the chain-dotted line M in FIGS. 12 to 14 represents the outer edge of the encapsulation resin 17.

[Fourth Embodiment]

Figure 15:
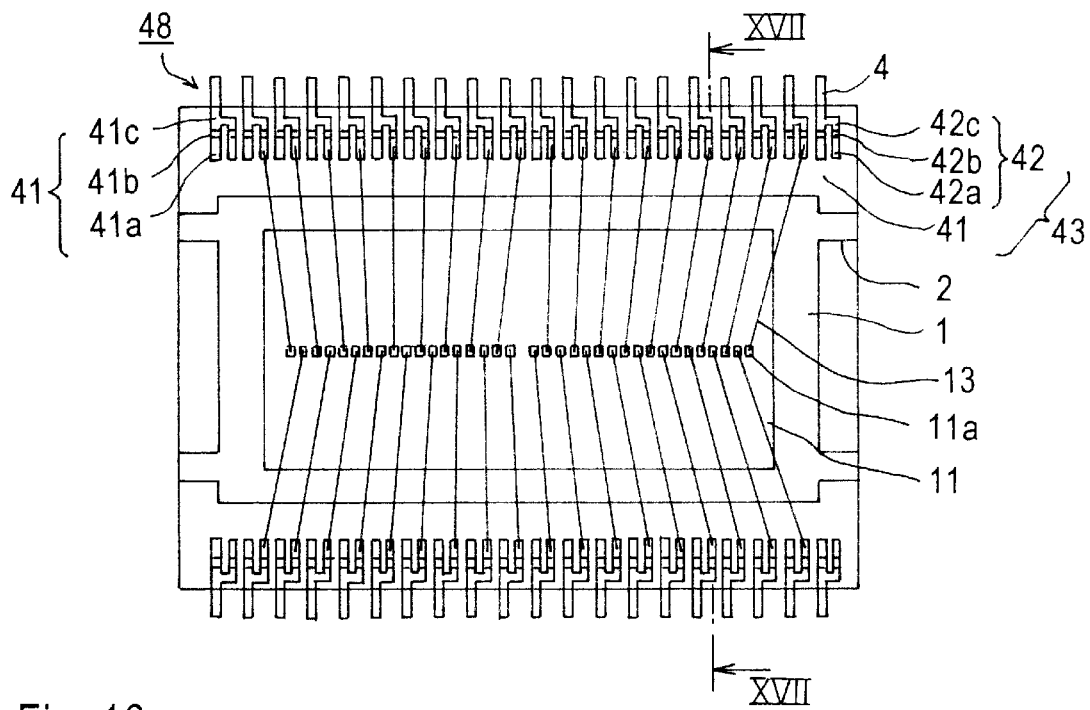
FIG. 15 is a plan view of a section of a main part of a resin-encapsulated semiconductor device according to a fourth embodiment of the present invention on one surface side.
Figure 16:
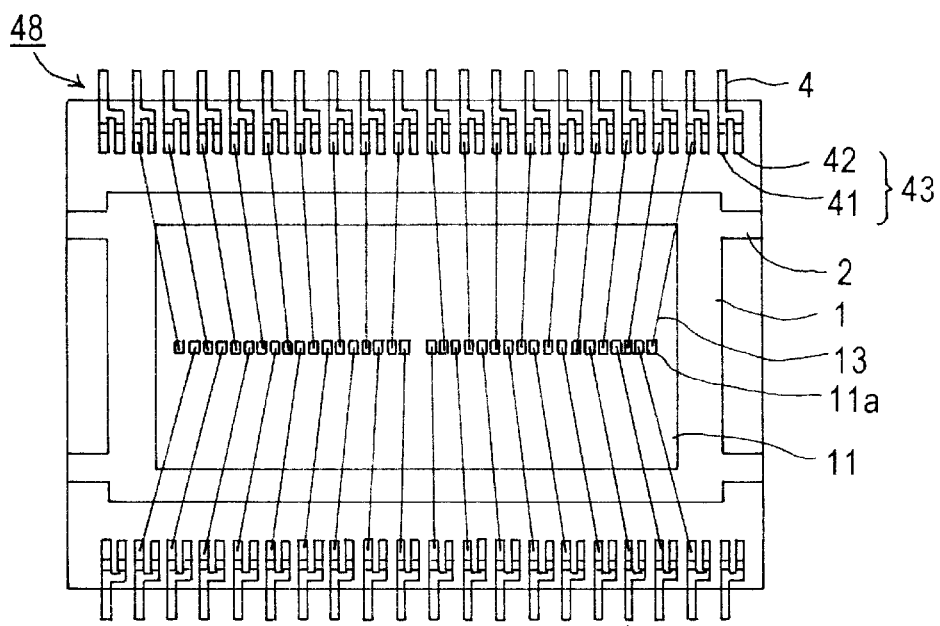
FIG. 16 is a plan view of a section of the main part on the opposite surface side to the surface in FIG. 15.
Figure 17:
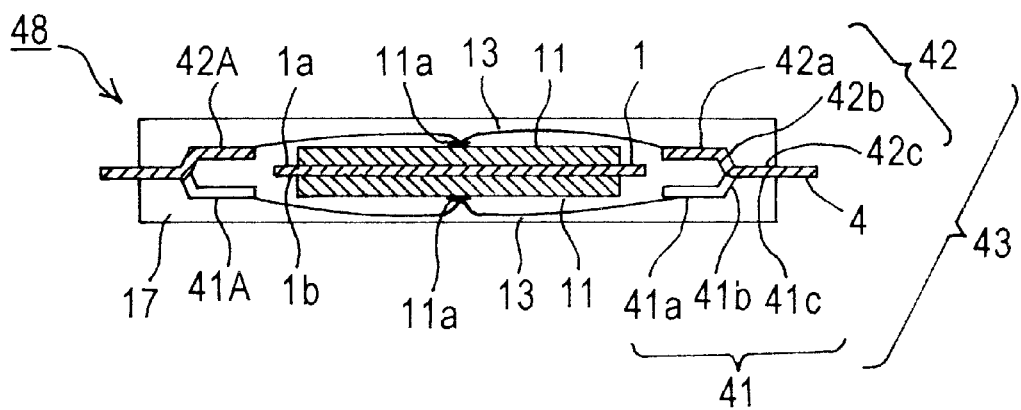
FIG. 17 is a sectional view taken along. line XVII—XVII in FIG. 15.
Figure 18:
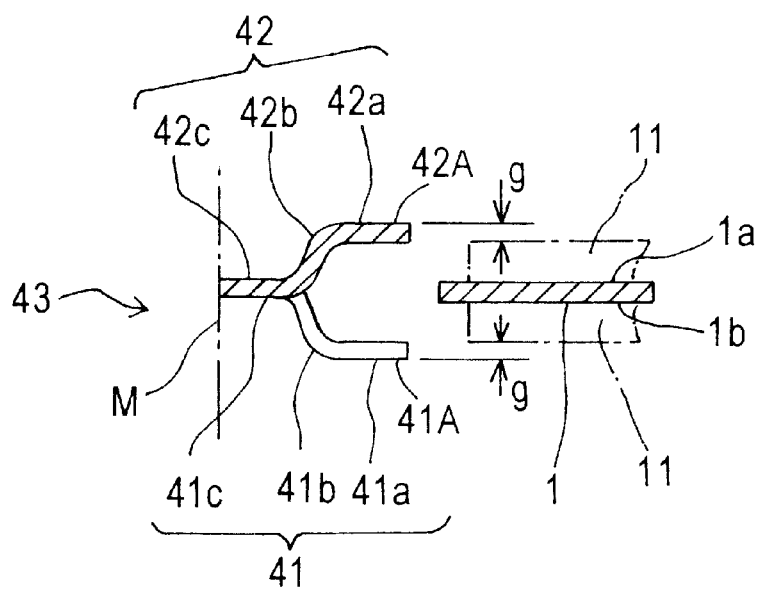
FIG. 18 is an enlarged view of the inner lead in FIG. 17.

FIG. 15 is a plan view of a section of a main part of a resin-encapsulated semiconductor device according to a fourth embodiment of the present invention on one surface side, FIG. 16 is a plan view of a section of the main part on the opposite surface side to the surface shown in FIG. 15, FIG. 17 is a sectional view taken along line XVII—XVII in FIG. 15, and FIG. 18 is an enlarged view of the inner lead in FIG. 17. The inner lead 43 according to the fourth embodiment has a first inner lead portion 41, and a second inner lead portion 42 branched therefrom. The first inner lead portion 41 has an inner lead inner end portion 41a, a bent portion 41b and an inner lead root portion 41c, while the second inner lead portion 42 has an inner lead inner end portion 42a, a bent portion 42b, and an inner lead root portion 42c. A first surface 41A is formed at the lower surface of the inner end portion 41a, while a second surface 42A is formed at the upper surface of the inner end portion 42a. The inner lead portions 41, 42 branch so that they are adjacent to each other at their root portions 41c and 42c. The inner end portion 41a of the inner lead portion 41 extends to the lower side of the die bond surface 1b and the inner end portion 42a of the inner lead portion 42 extends to the upper side of the die bond surface 1a after the bent portions 41b and 42b, respectively.

As shown, in the manufacture of the resin-encapsulated semiconductor device 48 according to the fourth embodiment, the semiconductor chip 11 (the upper side semiconductor chip 11) is die-bonded to the first die bond surface 1a of the die pad 1 provided virtually in the middle of the thickness of the encapsulation resin 17, and then the electrode 11a of the semiconductor chip 11 and the second surface 42A at the upper surface of the inner end portion 42a provided on a plane positioned above the upper surface 11b of the upper side semiconductor chip 11 by at most 50 µm are wire-bonded with a metal wire 13. Then, the semiconductor chip 11 (the lower side semiconductor chip) is die-bonded to the second die bond surface 1b of the die pad 1, and the electrode 11a of the lower side semiconductor chip 11 and the first surface 41A at the lower surface of the inner end portion 41a provided on a plane positioned below the lower surface of the lower side semiconductor chip 11 by at most 50 µm are wire-bonded with a metal wire 13. Then, the die pad 1, the upper and lower semiconductor chips 11, the metal wires 13, the first inner lead portion 41, the second inner lead portion 42 and the suspending lead 2 are integrally encapsulated with the encapsulation resin 17, and the same effect as that brought about by the third embodiment is provided.

As shown in FIGS. 15 to 18, the inner lead 43 according to the fourth embodiment has the first inner lead portion 41 including a first inner lead root portion 41c provided adjacent to the outer lead 4 formed flush with the die pad 1, a bent portion 41b bent downwardly from the first inner lead root portion 41c, and a first inner lead tip end portion 41a provided adjacent to the bent portion 41b, and the second inner lead portion 42 including a branch inner lead root portion 42c branched to the adjacent side portion on the same plane from the first inner lead root portion 41c, a bent portion 42b bent upwardly from the branch inner lead root portion 42c, and a second inner lead tip end portion 42a provided adjacent to the bent portion 42b. As shown in FIGS. 15 to 17, the electrode 11a of the upper side semiconductor chip 11 die-bonded to the first die bond surface 1a of the die pad 1 and the second surface 42A at the upper surface of the branch inner lead inner end portion 42a are wire-bonded using a metal wire 13, while the electrode 11a of the lower side semiconductor chip 11 die-bonded to the second die bond surface 1b of the die pad 1 and the first surface 41A at the lower surface of the first inner lead tip end portion 41a are wire-bonded with a metal wire 13, which is different from the third embodiment.

As shown in detail in FIG. 18, the first surface 41A at the lower surface of the first inner lead inner end portion 41a is provided on a plane parallel to the second die bond surface 1b of the die pad 1, and below the lower surface of the lower side semiconductor chip 11 die-bonded to the second die bond surface 1b by a size g. Meanwhile, the second surface 42A at the upper surface of the branch inner lead inner end portion 42a is provided on a plane parallel to the first die bond surface 1a of the die pad 1 and positioned above the upper surface of the upper side semiconductor chip 11 die-bonded to the die bond surface 1a by the size g. The size g is set to be at most 50 μm. Note that the structure of the lead frame used for the resin-encapsulated semiconductor device according to the fourth embodiment is the same as that shown in FIG. 6 other than those described in conjunction with FIGS. 15 to 18. The above-described structure of the inner lead 43 prevents the metal wires 13 from contacting the edge of each semiconductor chip 11 at the time of wire bonding. Note that the chain-dotted line M in FIG. 18 represents the outer edge of the encapsulation resin 17.

[Fifth Embodiment]

Figure 19:
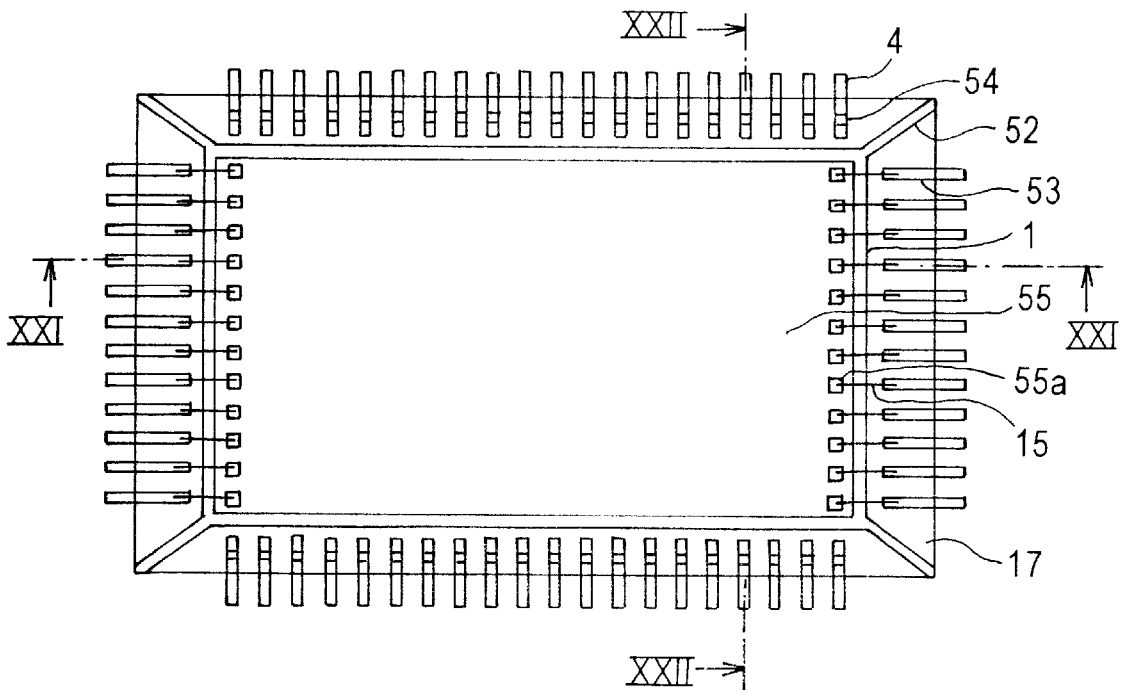
FIG. 19 is a plan view of a section of a main part of a resin-encapsulated semiconductor device according to a fifth embodiment of the present invention on one surface side.
Figure 20:
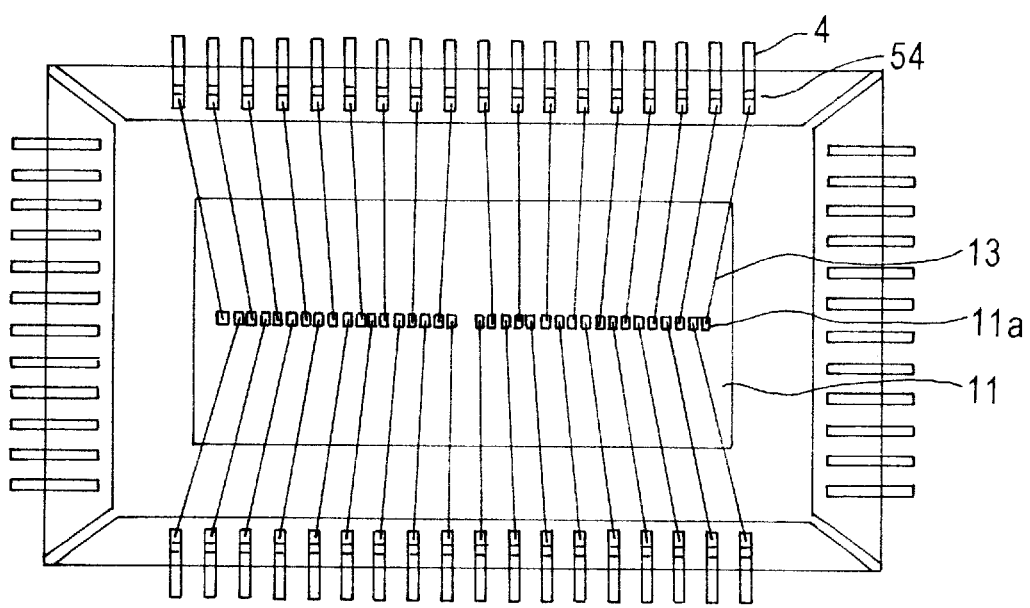
FIG. 20 is a plan view of a section of the main part on the opposite side to the surface in FIG. 19.
Figure 21:
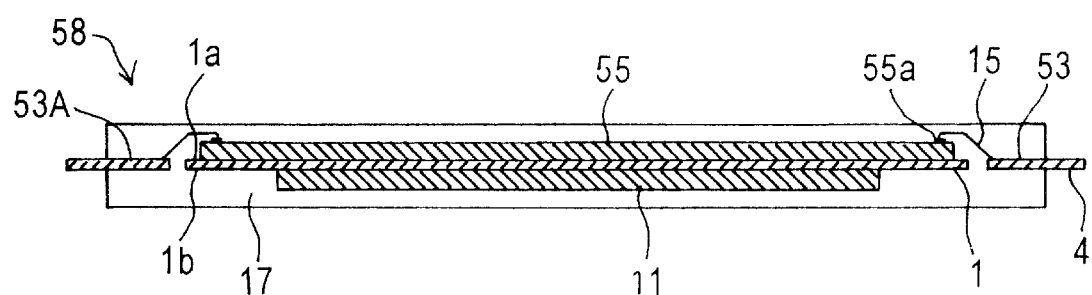
FIG. 21 is a sectional view taken along line XXI—XXI.
Figure 22:
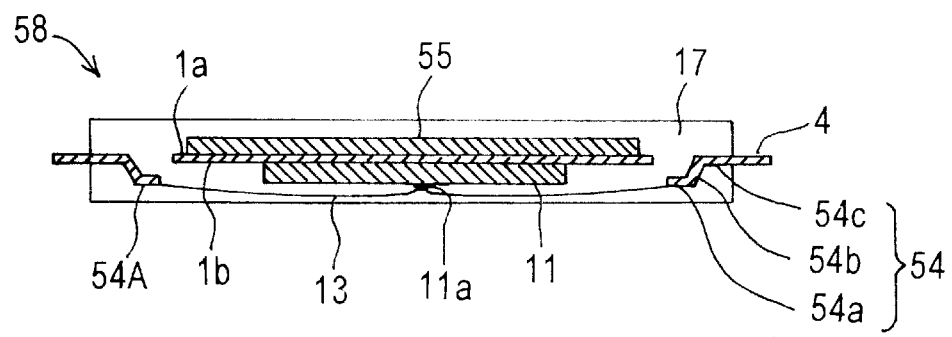
FIG. 22 is a sectional view taken along line XXII—XXII in FIG. 19.

FIG. 19 is a plan view of a section of a main part of a resin-encapsulated semiconductor device according to a fifth embodiment of the present invention on one surface side, FIG. 20 is a plan view of a section of the main part on the opposite surface side to the surface shown in FIG. 19, FIG. 21 is a sectional view taken along line XXI—XXI in FIG. 19, and FIG. 22 is a sectional view taken along line XXII—XXII in FIG. 19. As shown, in the manufacture of the resin-encapsulated semiconductor device 58 according to the fifth embodiment, a back surface of a semiconductor chip 55 having an integrated circuit for a flash memory formed on a surface thereon and having a rectangular two-dimensional shape for example is die-bonded to the first die bond surface 1a of the die pad 1 provided virtually in the middle of the thickness of the encapsulation resin 17, and an electrode 55a provided in the vicinity of both ends on the shorter sides and a second inner lead 53 provided in the close proximity of the electrode 55a are wire-bonded with a metal thin line 15.

The back surface of the center pad type, semiconductor chip 11 described above is die-bonded to the die pad surface 1b of the die pad 1, and an electrode 11a provided on the centerline in the center of the surface and an inner lead tip end portion 54a of a first inner lead 54 provided in the close proximity of both ends on the lower sides of the semiconductor chip 11 are wire-bonded with a metal wire 13. In this case, a first surface 54A at the lower surface of the inner lead inner end portion 54a of the first inner lead 54 is provided on a plane parallel to the second die bond surface 1b of the die pad 1 and positioned below the lower surface of the semiconductor chip 11 die-bonded to the die bond surface 1b by at most 50 μm. Reference numeral 52 represents a suspending lead supporting the die pad 1.

After the assembling as described above, the die pad 1, the semiconductor chips 11, 55, the metal wires 13, 15, the first inner lead 54, the second inner lead 53 and the suspending lead 52 are integrally encapsulated with encapsulation resin 17, and the outer lead 4 is processed into a prescribed shape, so that the resin-encapsulated semiconductor device 58 is completed. The resin-encapsulated semiconductor device 58 according to the fifth embodiment has the above-described structure, and therefore the same effect as that brought about by the first embodiment can be provided.

Figure 23:
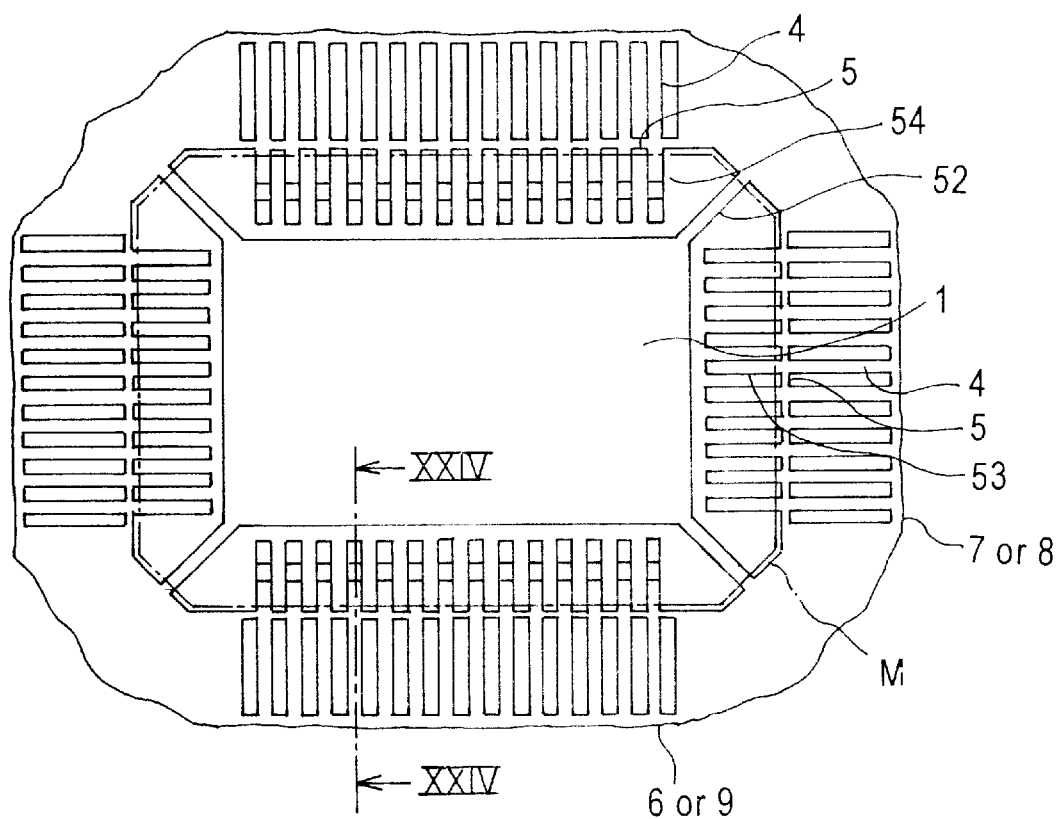
FIG. 23 is a plan view of a resin-encapsulated part in a lead frame in the resin-encapsulated semiconductor device according to the fifth embodiment of the present invention.
Figure 24:
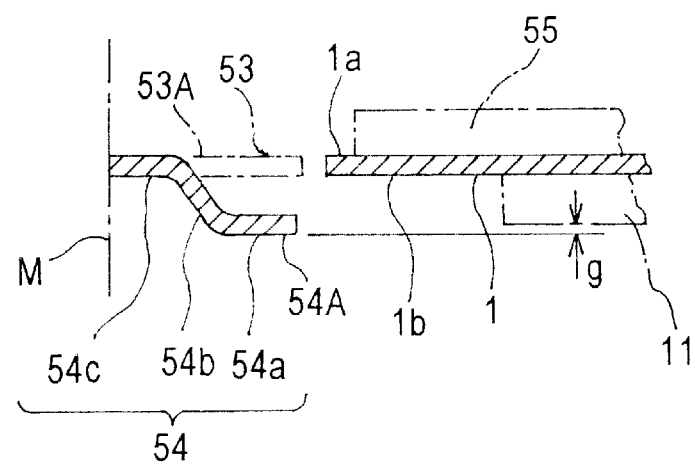
FIG. 24 is a sectional view taken along line XXIV—XXIV in FIG. 23.

The structure of the lead frame used in the resin-encapsulated semiconductor device 58 described above will be now described. FIG. 23 is a plan view of a resin-encapsulated part in the lead frame in the resin-encapsulated semiconductor device according to the fifth embodiment of the invention, and FIG. 24 is a sectional view taken along line XXIV—XXIV in FIG. 23. As shown in FIG. 23, in the resin-encapsulated semiconductor device according to the fifth embodiment, the outer leads project on the four sides, so that the four corner portions of the die pad 1 are supported by the suspending lead 52 coupled to the vertical outer frame 7 or the vertical direction separator 8 of the lead frame. Then, the inner leads 54 on the longer sides are provided adjacent to the outer leads 4 which are coupled with one another by a tie bar 5, and have their ends coupled to the vertical outer frame 7 or the vertical direction separator 8. The inner leads 53 on the shorter sides are provided adjacent to the outer leads 4 which are coupled one another by a tie bar 5, and have their ends coupled to the horizontal frame 6 or the horizontal direction separator 9.

As shown in FIG. 24, the inner lead inner end portion 54a is bent downwardly from the inner lead root portion 54c formed flush with the die pad 1 to the bent portion 54b and extends toward the side of the semiconductor chip 11. The second surface 54A at the lower surface of the inner end portion 54a is provided on a plane parallel to the second die bond surface 1b of the die pad 1 and positioned below the lower surface of the semiconductor chip 11 die-bonded to the second surface 1b of the die pad 1 by a size g. The size g is set to be at most 50 μm. Note that the second inner lead 53 on the shorter side is formed flush with the die pad as shown by the chain-dotted line, and a metal thin line 15 is wire-bonded to the first surface 53A at the upper surface. The structure of the lead frame used according to the fifth embodiment is the same as that shown in FIG. 6 other than those shown in FIGS. 23 and 24. The chain-dotted line M in FIGS. 23 and 24 represents the outer edge of the encapsulation resin 17.

[Sixth Embodiment]

Figure 25:
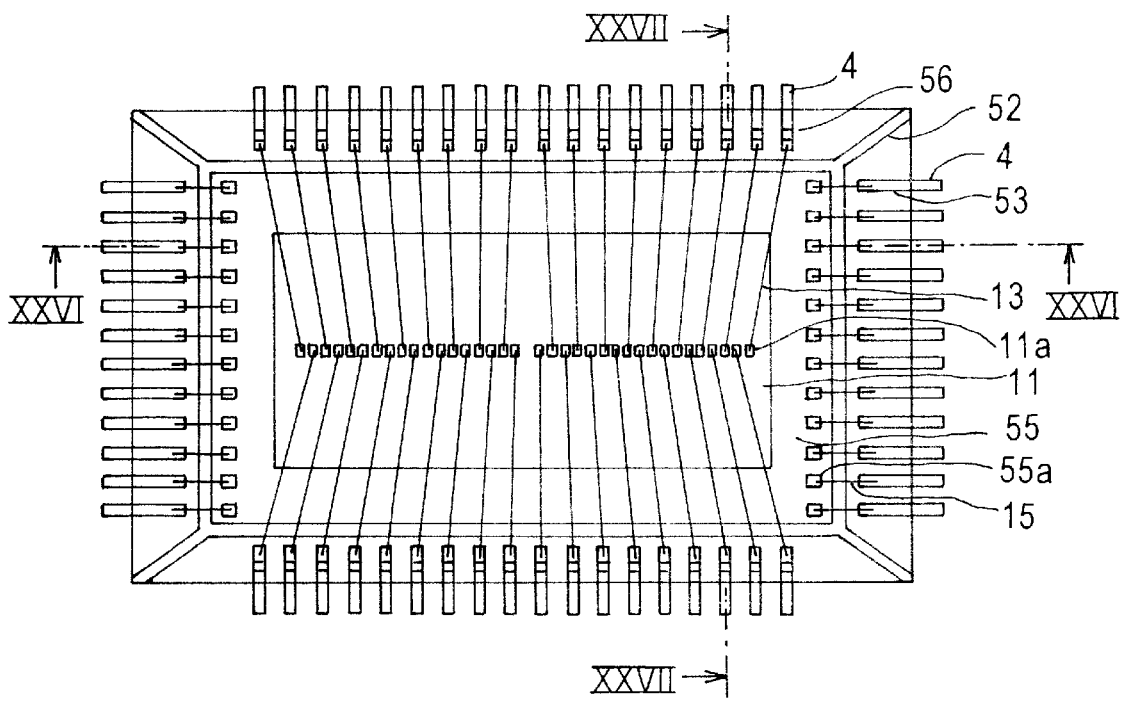
FIG. 25 is a plan view of a section of a main part of a resin-encapsulated semiconductor device according to a sixth embodiment of the present invention.
Figure 26:
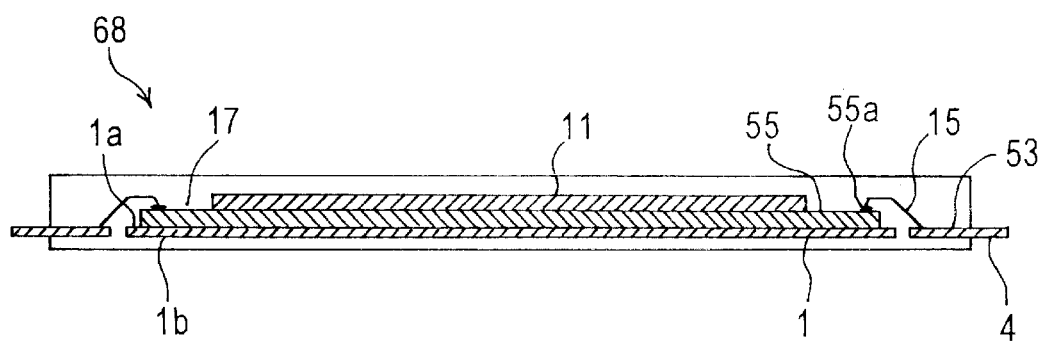
FIG. 26 is a sectional view taken along line XXVI—XXVI in FIG. 25.
Figure 27:
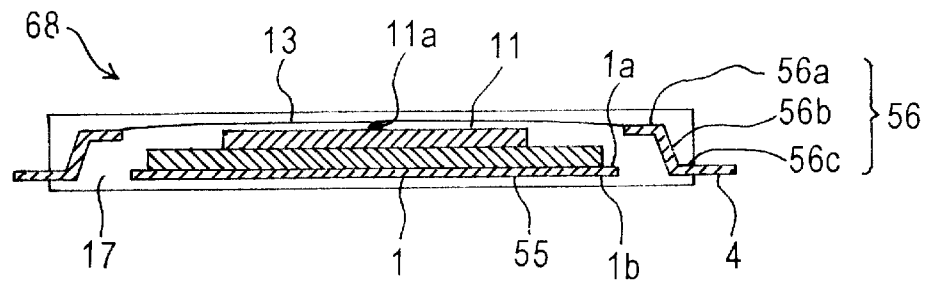
FIG. 27 is a sectional view taken along line XXVII—XXVII in FIG. 25.
Figure 28:
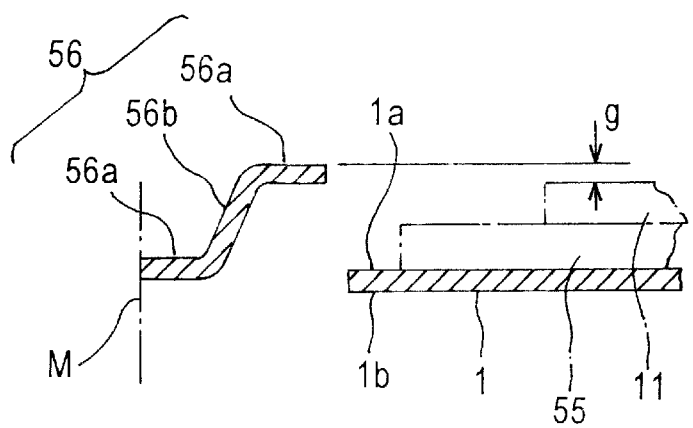
FIG. 28 is an enlarged view of the inner lead shown in FIG. 27.

FIG. 25 is a plan view of a section of a main part of a resin-encapsulated semiconductor device according to a sixth embodiment of the present invention, FIG. 26 is a sectional view taken along line XXVI—XXVI in FIG. 25, FIG. 27 is a sectional view taken along line XXVII—XXVII in FIG. 25, and FIG. 28 is an enlarged view of the inner lead shown in FIG. 27. AS shown, in the manufacture of the resin-encapsulated semiconductor device 68 according to the sixth embodiment of the present invention, a back surface of a semiconductor chip 55 is die-bonded to the first die bond surface 1a of the die pad 1, and a semiconductor chip 11 is die-bonded onto the semiconductor chip 55 using an insulating adhesive or an insulating adhesive tape (not shown). Thus, an electrode 55a provided on both ends on the shorter sides of the semiconductor chip 55 and a first surface 55A at the upper surface of the inner end portion of a second inner lead 53 provided in the close proximity to the electrode 55a are wire-bonded with a metal wire 15, while the electrode 11a provided in the center of the semiconductor chip 11 and a second surface 56A at the upper surface of the inner lead inner end portion 56a of a first inner lead 56 provided in the close proximity to both ends of the semiconductor chip 11 on the longer sides are wire-bonded with a metal wire 13.

In this case, as shown in FIG. 28, the first inner lead 56 has an inner lead root portion 56c provided adjacent to the outer lead 4 formed flush with the die pad 1, and a bent portion 56b bent upwardly from the inner lead root portion 56c, and an inner end portion 56a extending toward the semiconductor chip 11 from the bent portion 56b. The second surface 56A at the upper surface of the inner end portion 56a is provided at a position parallel to the first die bond surface 1a of the die pad 1 and above the upper surface of the semiconductor chip 11 by a size g of at most 50 μm. This structure of the first inner lead 56 prevents the metal wire 13 from contacting the edge of the semiconductor chip 11 at the time of wire bonding using the metal wire 13.

After the assembling as described above, the die pad 1, the semiconductor chips 11, 55, the metal thin lines 13, 15, the first inner lead 56, the second inner lead 53 and the suspending lead 52 are integrally encapsulated with the encapsulations resin 17, and the outer lead 4 is processed into a prescribed shape, so that the resin-encapsulated semiconductor device 58 is completed. Note that the distances between the metal wire 13 and the upper surface of the encapsulation resin 17 and between the second surface of the die pad 1 and the lower surface of the encapsulation resin 17 are both set to be at least 50 μm, so that the metal wire 13 and the die pad 1 are prevented from being exposed at the outer surface of the encapsulation resin 17 and a high quality, thin package is formed. The resin-encapsulated semiconductor device 68 according to the sixth embodiment is formed as described above, and therefore the same effect as that brought about by the first embodiment is provided.

[Seventh Embodiment]

Figure 29:
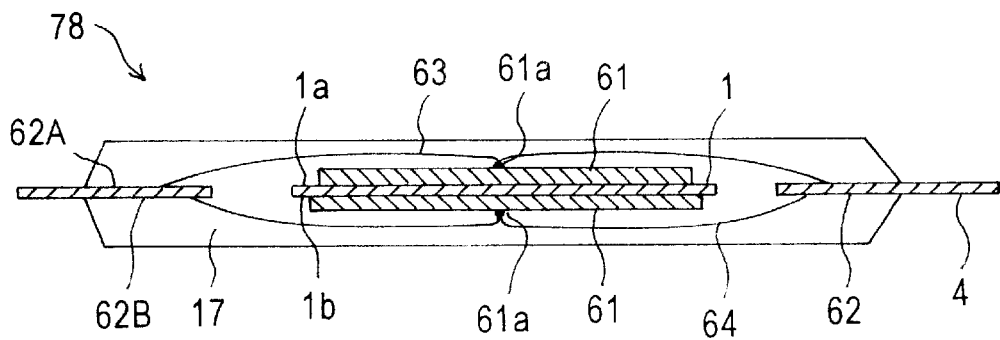
FIG. 29 is a sectional view of a resin-encapsulated semiconductor device according to a seventh embodiment of the present invention.

FIG. 29 is a sectional view of a resin-encapsulated semiconductor device according to a seventh embodiment of the present invention. As described above, with the advent of various highly functional, compact and lightweight electronic devices, the demand for thinner resin-encapsulated semiconductor devices will be greater. Therefore, the thickness of semiconductor chips must be reduced. At present, the thickness of thin center pad type semiconductor chips is about in the range from 300 μm to 350 μm, and if the thickness of the semiconductor chips is reduced to 150 μm or less to meet the demand for reducing the thickness, the problem associated with contacting between the metal wire and the semiconductor chip edge will be almost insignificant enough to be ignored.

The structure of the resin-encapsulated semiconductor device according to the seventh embodiment is applicable to the following case in which such an ultra thin type semiconductor chip is used.

In FIG. 29, in the manufacture of a resin-encapsulated semiconductor device 78, a. back surface of a center pad type semiconductor chip 61 (upper side semiconductor chip 61) having a thickness of 150 μm or less is die-bonded to the first die bond surface 1a of the die pad 1, and an electrode 61a provided on the centerline of the upper side semiconductor chip 61 and a first surface 62A at the upper surface of an inner lead 62 formed flush with the die pad 1 are wire-bonded with a metal wire 63. A back surface of a similar center pad type, semiconductor chip 61 (lower side semiconductor chip 61) is die-bonded to the second die bond surface 1b of the die pad 1. Then, the electrode 61a provided on the centerline of the lower semiconductor chip 61 and a second surface 62B at the back surface of the inner lead 62 are wire-bonded with a metal wire 64. The die pad 1, the two semiconductor chips 61, the metal wires 63, 64, the inner lead 62 and a tie bar (not shown) are integrally encapsulated with encapsulations resin 17. Note that the wire bonding is executed by a general ultrasonic bonding method. The above described structure of the resin-encapsulated semiconductor device according to the seventh embodiment allows the lead frame to have a simple structure, and in addition to the effect brought about by the third embodiment, a more inexpensive resin-encapsulated semiconductor device can be provided.

Note that in the first, second, fifth and sixth embodiments, center pad type semiconductor chips having a 64M DRAM and a semiconductor chip with electrodes provided in the periphery having a flash memory are combined by way of illustration. Meanwhile, semiconductor chips both having electrodes arranged in the periphery and different functions such as semiconductor chips for center pad type 64M DRAM and microcomputer may be combined. Such a combination of semiconductor chips having different functions results in a highly functional, thin, compact and inexpensive resin-encapsulated semiconductor device. In the third, fourth and seventh embodiments, two center pad type semiconductor chips having a 64M DRAM are combined, and in this case, a thin, compact and inexpensive resin-encapsulated semiconductor device with large memory capacity can be provided. However, in any of the above-described embodiments, semiconductor chips having the same or different functions may be combined.

What is claimed is:

1. A resin-encapsulated semiconductor device, comprising:
   a die pad having first and second die bond surfaces opposing each other,
   a first semiconductor chip die-bonded on the first die bond surface having a plurality of electrodes on a centerline at the center of an upper surface thereof,
   first metal wires each connected to each electrode of the first semiconductor chip,
   a second semiconductor chip die-bonded on the second die bond surface having a plurality of electrodes on a centerline at the center of an upper surface thereof,
   second wires each connected to each electrode of the second semiconductor chip,
   a plurality of inner leads arranged near an end of the die pad, wherein
      the plurality of inner leads each having a first surface to which each of the first metal wires is wire-bonded, and a second surface to which each of the second metal wires is wire-bonded, and
      the first and second surfaces being positioned on different planes substantially parallel to the die bond surface and apart from one another.

2. A resin-encapsulated semiconductor device, comprising:
   a die pad having two opposing die bond surfaces,
   two semiconductor chips each die-bonded to each of the die bond surfaces, and having a thickness of at most 150 μm provided with electrodes on a centerline in the center of an upper surface thereof, metal wires each wire-bonded to each of electrodes of each of the semiconductor chips, a plurality of inner leads provided in the close proximity to a pair of opposing ends of the die pad along the electrode arrangement of the semiconductor chip and to which each of the metal wires connected to the surface in the vicinity of the inner end thereof, and a encapsulation resin with which the semiconductor chips, the die pad, the metal wires and the inner leads are encapsulated.

3. A resin-encapsulated semiconductor device comprising;

a die pad having first and second die bond surface opposing each other, a first semiconductor chip die-bonded on the first die bond surface and having a plurality of electrodes on a centerline at the center of upper surface thereof, first metal wires each connected to each electrode of the first semiconductor chip, a second semiconductor chip die-bonded on the second die bond surface and having a plurality of electrodes at an end of lower surface thereof, second metal wires each connected to each electrode of the second semiconductor chip, and a plurality of inner leads arranged near an end of the die pad, wherein the plurality of inner leads each has a first portion positioned on the substantially same plane as the die pad and has a first surface to which each of the second metal wires is wire-bonded, the plurality of inner leads each also has a second portion disposed on the plane positioned above the die pad and has a second surface to which each of the first metal wires is wire-bonded, the first and second surfaces are substantially parallel to the first and second die bond surface and each of the second surface is positioned above the upper surface of the first semiconductor chip by a prescribed size.

4. The resin-encapsulated semiconductor device claimed in claim 3, wherein the first portion and the second portion is continued by a bent portion.

5. The resin-encapsulated semiconductor device claimed in claim 3, wherein the prescribed size is set to be at most 50 µm.

6. The resin-encapsulated semiconductor device claimed in claim 3, wherein the first and second semiconductor chips are provided so that the arrangement direction of their electrodes are substantially parallel to each other.

7. The resin-encapsulated semiconductor device claimed in claim 3, wherein the first and second semiconductor chips are provided with integrated circuits having different functions from each other.

8. A resin-encapsulated semiconductor device comprising;

a die pad having a die bond surface, a first semiconductor chip die-bonded on the die bond surface and having a plurality of electrodes at an end of upper surface thereof, first metal wires each connected to each electrode of the first semiconductor chip, a second semiconductor chip bonded on the upper surface of the first semiconductor chip and having a plurality of electrodes on a centerline at the center of upper surface of the second semiconductor chip, second metal wires each connected to each electrode of the second semiconductor chip, and a plurality of inner leads arranged near an end of the die pad, wherein the plurality of inner leads each has a first portion positioned on the substantially same plane as the die pad and has a first surface to which each of the first metal wires is wire bonded, plurality of inner leads each also has a second portion disposed on the plane positioned above the die pad and has a second surface to which each of the second metal wires is wire-bonded, the first and second surfaces are substantially parallel to the die bond surface and each of the second surface is positioned above the upper surface of the first semiconductor chip by a prescribed size.

9. The resin-encapsulated semiconductor device claimed in claim 8, wherein the first portion and second portion are branched from one another.

10. The resin-encapsulated semiconductor device claimed in claim 8, wherein the prescribed size is set to be at most 50 µm.

11. The resin-encapsulated semiconductor device claimed in claim 8, wherein the first and second semiconductor chips are provided so that the arrangement direction of their electrodes are substantially parallel to each other.

12. The resin-encapsulated semiconductor device claimed in claim 8, wherein the first and second semiconductor chips are provided with integrated circuits having different functions from each other.

13. A resin-encapsulated semiconductor device comprising;

a die pad having first and second die bond surface opposing each other, a first semiconductor chip die bonded on the first die bond surface and having a plurality of electrodes on a centerline at the center of upper surface thereof, first metal wires each connected to each electrode of the first semiconductor chip, a second semiconductor chip die-bonded on the second die bond surface and having a plurality of electrodes on a centerline at the center of lower surface thereof, second metal wires each connected to each electrode of the second semiconductor chip, and a plurality of inner leads arranged near an end of the die pad, wherein the plurality of inner leads each has a first portion disposed on the plane positioned above the die pad and has a first surface to which each of the first metal wires is wire-bonded, the plurality of inner leads each also has a second portion disposed on the plane positioned below the die pad and has a second surface to which each of the second metal wires is wire-bonded, the first and second surfaces are substantially parallel to the first and second die bond surface and the first surface is positioned above the upper surface of the first semiconductor chip and the second surface is positioned below the lower surface of the second semiconductor chip, by a prescribed size respectively.

14. The resin-encapsulated semiconductor device claimed in claim 13, wherein the first portion and second portion are continued by a bent portion.

15. The resin-encapsulated semiconductor device; claimed in claim 13, wherein the prescribed size is set to be at most 50 μm.

16. The resin-encapsulated semiconductor device claimed in claim 13, wherein the first and second semiconductor chips are provided so that the arrangement direction of their electrodes are substantially parallel to each other.

17. The resin-encapsulated semiconductor device claimed in claim 13, wherein the first and second semiconductor chips are provided with integrated circuits having same function.

18. The resin-encapsulated semiconductor device claimed in claim 13, wherein the first and second portions branched from one another.

19. A resin-encapsulated semiconductor device comprising;
   a die pad having first and second die bond surface opposing each other,
   a first semiconductor chip die-bonded on the first die bond surface and having a plurality of electrodes at an end of upper surface thereof,
   first metal wires each connected to each electrode of the first semiconductor chip,
   a second semiconductor chip die-bonded on the second die bond surface and having a plurality of electrodes on a centerline at the center of lower surface thereof,
   second metal wires each connected to each electrode of the second semiconductor chip,
   a plurality of first inner leads arranged on an end of the die pad near the plurality of electrodes of the first semiconductor chip and
   a plurality of second inner leads arranged on an other end of the die pad, wherein
      the plurality of the first inner leads each positioned substantially same plane as the die pad and has a first surface to which each of the first metal wires is wire-bonded,
      the plurality of second inner leads each has first and second portions,
      the first portion of each of the second inner leads positioned substantially same plane as the die pad,
      the second portion of each of the second inner leads disposed on the plane positioned below the die pad and has a second surface to which each of the second metal wires is wire-bonded,
      the first and second surfaces are substantially parallel to the first and second die bond surface,
      the second surface is positioned below the lower surface of the second semiconductor chip by a prescribed size.

20. The resin-encapsulated semiconductor device claimed in claim 19, wherein
   the first portion and the second portion of the second inner lead are continued by a bent portion.

21. The resin-encapsulated semiconductor device claimed in claim 19, wherein the prescribed size is set to be at most 50 μm.

22. The resin-encapsulated semiconductor device claimed in claim 19, wherein the first and second semiconductor chips are provided so that the arrangement direction of their electrodes are substantially perpendicular to each other.

23. The resin-encapsulated semiconductor device claimed in claim 19, wherein the first and second semiconductor chips are provided with integrated circuits having different functions from each other.

24. A resin-encapsulated semiconductor device comprising;
   a die pad having a die bond surface,
   a first semiconductor chip die-bonded on the die bond surface and having a plurality of electrodes at an end of upper surface thereof,
   first metal wires each connected to each electrode of the first semiconductor chip,
   a second semiconductor chip bonded on the upper surface of the first semiconductor chip and having a plurality of electrodes on a centerline at the center of the upper surface of the second semiconductor chip,
   second metal wires each connected to each electrode of the second semiconductor chip,
   a plurality of first inner leads arranged on an end of the die pad near the plurality of electrodes of the first semiconductor chip and
   a plurality of second inner leads arranged on an other end of the die pad, wherein the plurality of the first inner leads each positioned substantially same plane as the die pad and has a first surface to which each of the first metal wires is wire-bonded,
      the plurality of the second inner leads each has first and second portions,
      the first portion of each of the second inner leads positioned substantially same plane as the die pad,
      the second portion of each of the second inner leads positioned above the die pad and has a second surface to which each of the second metal wires is wire-bonded,
      the first and second surfaces are substantially parallel to the die bond surface,
      the second surface is positioned above the upper surface of the second semiconductor chip by a prescribed size.

25. The resin-encapsulated semiconductor device claimed in claim 24, wherein
   the first portion and second portion of the second inner lead are continued by a bent portion.

26. The resin-encapsulated semiconductor device claimed in claim 24, wherein
   the prescribed size is set to be at most 50 μm.

27. The resin-encapsulated semiconductor device claimed in claim 24, wherein
   the first and second semiconductor chips are provided so that the arrangement direction of their electrodes are substantially perpendicular to each other.

28. The resin-encapsulated semiconductor device claimed in claim 24, wherein
   the first and second semiconductor chips are provided with integrated circuits having different functions from each other.

* * * * *